United States Patent
Doerr

(12) 
(10) Patent No.: US 6,243,402 B1
(45) Date of Patent: Jun. 5, 2001

(54) MULTI-FREQUENCY RAPIDLY TUNABLE LASER

(75) Inventor: Christopher Richard Doerr, Middletown, NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/386,872

(22) Filed: Aug. 31, 1999

(51) Int. Cl.[7] .......................................................... H01S 3/10
(52) U.S. Cl. .................................. 372/20; 372/64; 372/98
(58) Field of Search ................................... 372/20, 64, 98

(56) References Cited

U.S. PATENT DOCUMENTS

| | | | |
|---|---|---|---|
| 5,373,517 | * 12/1994 | Dragone et al. | 372/20 |
| 6,014,390 | * 1/2000 | Joyner | 372/20 |
| 6,023,480 | * 2/2000 | Dragone | 372/64 |

OTHER PUBLICATIONS

M. Zirngibl et al, "Digitally Tunable Laser Based on the Integration of a Waveguide Grating Multiplexer and an Optical Amplifier", IEEE Photonics Technology Letters, vol. 6, No. 4, Apr. 1994, pp. 516–518.

M. K. Smit et al, "PHASAR–Based WDM–Devices: Principles, Design and Applications", IEEE Journal of Selected Topics in Quantum Electronics, vol. 2, No. 2, Jun. 1996, pp. 236–259.

H. Takahashi et al, "Arrayed–Waveguide Grating For Wavelength Division Multi/Demultiplexer With Nanometre Resolution", Electronics Letters, vol. 26, No. 2, 18th Jan. 1990, pp. 87–88.

C. Dragone, "An N x N Optical Multiplexer Using a Planar Arrangement of Two Star Couplers", IEEE Photonics Technology Letters, vol. 3, No. 9, Sep. 1991, pp. 812–815.

C. R. Doerr et al, "Chromatic Focal Plane Displacement in the Parabolic Chirped Waveguide Grating Router", IEEE Photonics Technology Letters, vol. 9, No. 5, May 1997, pp. 625–627.

Y. Tachikawa et al, "Arrayed–Waveguide Grating Lasers and Their Applications to Tuning–Free Wavelength Routing", IEEE Proc. Optoelectronics, vol. 143, No. 5, Oct. 1996, pp. 322–328.

* cited by examiner

*Primary Examiner*—Leon Scott, Jr.
(74) *Attorney, Agent, or Firm*—J. J. Brosemer

(57) ABSTRACT

A tunable laser incorporating an $N_1 \times N_2$ chirped waveguide grating router that has $N_1 N_2$ wavelengths, accessible in a digitally rapid manner, and using only $N_1+N_2+1$ semiconductor optical amplifiers. Through the use of chirp, free-spectral range of the router can be significantly less than the channel span. The exemplary laser has $N_1=5$, $N_2=8$, a channel spacing of 100 GHz, and the router free-spectral range is only 20 channels.

5 Claims, 7 Drawing Sheets

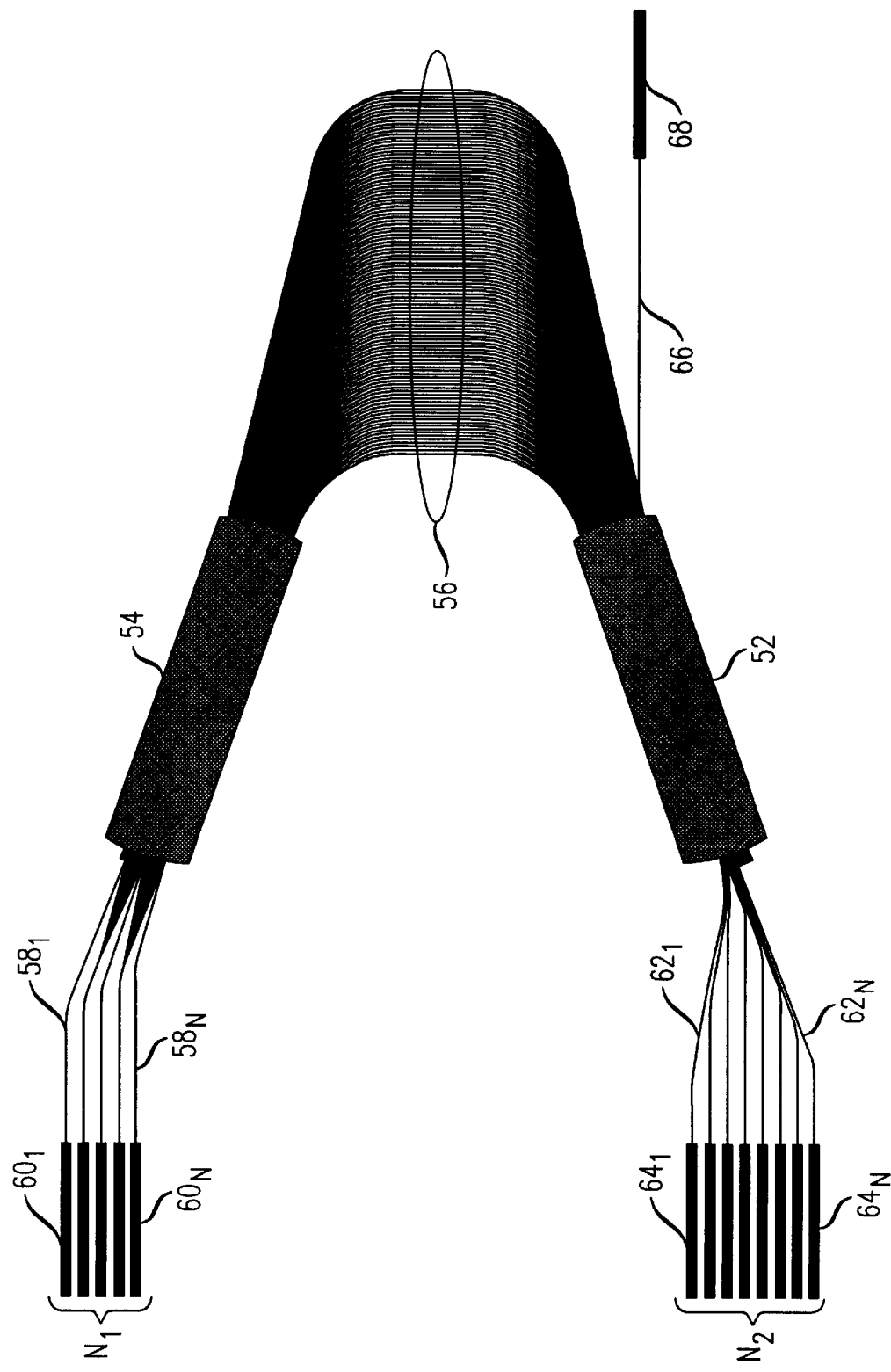

MULTI-FREQUENCY RAPIDLY TUNABLE LASER

FIELD OF THE INVENTION

This invention relates to optical communications and in particular to lasers used in optical communications systems.

BACKGROUND OF THE INVENTION

The capacity and speed of communications systems may be increased by transmitting information in optical form over networks composed of optically transmissive nodes, fibers, waveguides, and the like. High capacity optical communications systems require that many optical signals be frequency division multiplexed in the components of the optical network. This requires that there be a way of conveniently producing electromagnetic energy at many different frequencies. An ideal device for producing optical energy useful in an optical communications system is a laser, and in particular a multifrequency laser.

Conventional multifrequency lasers (MFL) consists of a waveguide grating router with a shared port on one side comprising one end of a Fabry-Perot cavity, and N array ports containing semiconductor optical amplifiers (SOAs) comprising the other. (See, e.g., M. Zirngibl, C. H. Joyner, L. W. Stulz, U. Koren, M.-D. Chien, M. G. Young, and B. I. Miller, "Digitally tunable laser based on the integration of waveguide grating multiplexer and an optical amplifier," *IEEE Photon. Technol. Lett.*, vol. 6, pp. 516–518, 1994; M. K. Smit and C. van Dam, "Phasar based WDM devices: Principles, design and applications," *IEEE J. Select. Topics Quantum Electron.*, vol. 2, pp. 236–250, 1996; H. Takahashi, S. Suzuki, K. Kato, and I. Nishi, "Arrayed-waveguide grating for wavelength division multi/demultiplexer with nanometer resolution," *Electron. Lett.*, vol. 26, pp. 87–88, 1990; and C. Dragone, "An N×N optical multiplexer using a planar arrangement of two star couplers," *IEEE Photon. Technol. Lett.*, vol. 3, pp. 812–815, 1991.

Turning on a particular SOA commences laser oscillation at a particular wavelength as dictated by the router. The conventional MFL thus has N possible oscillation wavelengths. By using $N_1$ ports with SOAs on one side and $N_2$ ports with SOAs on the other, one can have $N_1N_2$ oscillation wavelength, taking advantage of the $N_1 \times N_2$ properties of the waveguide grating router (WGR).

In a paper entitled "Arrayed-waveguide grating lasers and their applications to tuning-free wavelength routing," that appeared in *IEEE Proc.-Optoelectron.*, vol. 143, pp. 322–328, 1996, Y. Tachikawa and K. Okamoto demonstrated an $N_1 \times N_2$ laser (32 channels) using a silica WGR and mechanical switches, but they had to use a large WGR with a free-spectral range of $N_1N_2$, had high side modes from unwanted grating orders, and did not achieve single-mode operation. However, as shown by C. R. Doerr and C. H. Joyner, in a paper entitled "Double-chirping of the waveguide grating router," that appeared in *IEEE Photon. Technol. Lett.*, vol. 9., pp. 776–778, 1997, and by C. R. Doerr, M. Shirasaki, and C. H. Joyner, in a paper entitled "Chromatic focal plane displacement in the parabolic chirped waveguide grating router," which appeared in *IEEE Photon. Technol. Lett.*, vol. 9, pp. 625–627, 1997, one can employ chirp in the WGR design to significantly reduce the WGR size and suppress unwanted grating orders, greatly facilitating the achievement of single-mode operation.

Despite advances in the art however, there still remains a continuing need for apparatus that permit one to create a large number of optical frequencies with lasers suitable for optical communications systems.

SUMMARY OF THE INVENTION

I have developed a new, 40 wavelength rapidly tunable laser that provides a well-defined set of frequencies. This laser may be based upon photonic integrated circuitry which has a wide gain bandwidth and may be advantageously implemented at a lower cost than that needed to implement numerous prior lasers used in optical communications systems.

My $N_1 \times N_2$ laser is fully integrated in InP and uses a chirped WGR to produce 40 single-mode wavelengths from a compact chip using only 13 digital controls and one coarse analog control.

Further features and advantages of the present invention, as well as the structure and operation of various embodiments of the present invention are described in detail below with reference to the accompanying drawing.

BRIEF DESCRIPTION OF THE DRAWING

FIG. 5 is a layout diagram for the exemplary 5×8 laser according to the present invention;

DETAILED DESCRIPTION OF THE INVENTION

Figure 1:
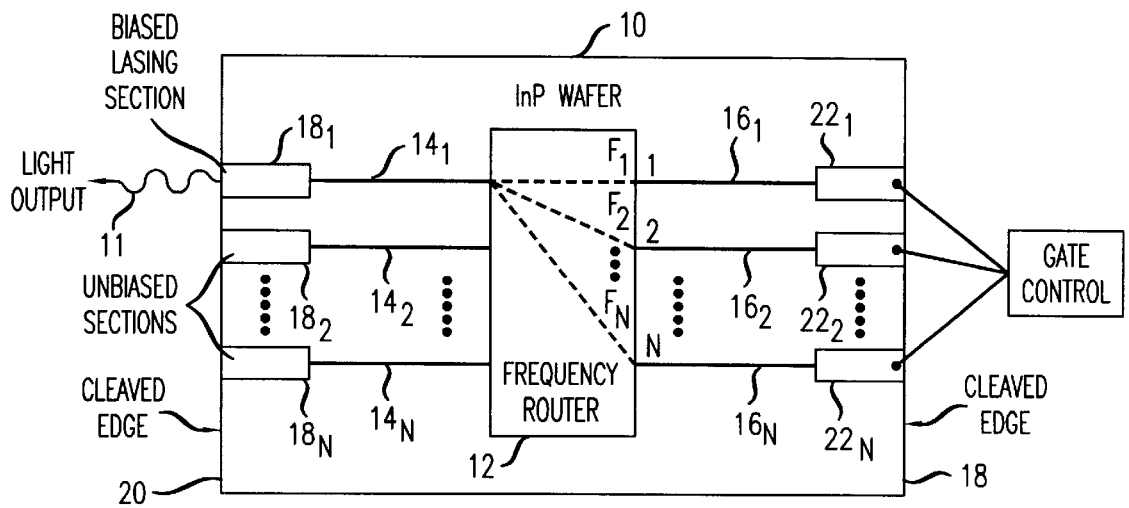
FIG. 1 is a diagram of a example of a prior art tunable laser.

By way of further background, FIG. 1 shows an example of a laser which is rapidly tunable over a wide frequency range and disclosed in U.S. Pat. No. 5,373,517 issued to Dragone et al on Dec. 13, 1994 and incorporated herein by reference in its entirety. The laser depicted threin is composed of a frequency routing device for providing frequency selectivity, a number of waveguides for carrying optical signals, and a number of optically active sections providing optical amplification and lasing behavior. These structures may be monolithically integrated on a semiconductive wafer. They may be constructed by known photolithographic techniques.

With continued reference now to FIG. 1, wafer 10 is made of a semiconductive material such as an indium phosphide based material such as InGaAsP. An N×N frequency routing device 12 is defined on the wafer 10. A first plurality of waveguides $14_1, 14_2, \ldots, 14_N$ is connected to one of the frequency routing device 12. A second plurality of waveguides $16_1, 16_2, \ldots, 16_N$ is connected to another end of the frequency routing device 12. A first plurality of optical amplifiers $18_1, 18_2, \ldots, 18_N$, connects respective ones of the first plurality of waveguides to a cleaved face 20 formed in the semiconductive wafer 10. A second plurality of waveguides $22_1, 22_2, \ldots, 22_N$, connects respective ones of the second plurality of waveguides to a second cleaved face 24 formed in the wafer 10. The two cleaved faces 20 and 24 comprise reflective mirrors defining a tuned cavity in which lasing action can be supported. Control circuit 25 selectively provides bias current to predetermined ones of the optical amplifiers to produce laser light at one of N discrete frequencies as indicated at refer3ence numeral 11 in FIG. 1.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow optical energy and will even provide some degree of gaon to optical signals flowing through them. When electrical bias current above a lasing threshold is applied, laser action begins. These doped sections of waveguide are substantially opaque to the transmission of light when there is no applied electrical stimulation. The specially doped sections thus may be considered to be gates or optical amplifiers depending upon whether or not they are excited with electrical energy. The details of creating such sections in a wafer such as the wafer 10 shown in FIG. 1. are generally known, and are not a part of this invention and therefore not described here.

Selectively applying bias current to predetermined ones of the optical amplifiers in FIG. 1 will create certain frequency selective optical pathways between the cleaved faces 20 and 24 due to the behavior of the frequency routing device 12. Application of a certain amount of bias current above a lasing threshold to the selected ones of the optical amplifiers will cause lasing action at a frequency supported in the frequency selective optical pathways. These optical amplifiers which are not given any bias current remain opaque to the transmission of optical energy through them.

The frequency routing device 12 is such that an optical frequency $F_1$ appearing on waveguide $14_1$ and flowing toward the device 12 will be directed to the waveguide $16_1$. An optical signal having a frequency $F_1$ directed toward the frequency routing device 12 on waveguide $16_1$ will be directed toward waveguide $14_1$. An optical signal having a signal $F_2$ directed toward the frequency routing device 12 will be directed to the waveguide $16_2$. An optical signal having a frequency $F_2$ directed toward the frequency routing device 12 on waveguide $16_2$ will be directed toward waveguide $14_1$. In general, an optical signal having a frequency $F_1$ appearing on waveguide $14_1$ and flowing toward the device 12 will be directed to a waveguide $16_1$ by the frequency routing device. Similarly, an optical signal having a frequency $F_1$ appearign on a waveguide $16_1$ and flowing toward the frequency routing device 12 will be directed to waveguide $14_1$.

The edges of the wafer at the ends of the two sets of optical amplifiers are cleaved to form reflective mirrors with a tunable cavity between them. The amplifiers on one side of the frequency routing device 12 are used as gates opened by the bias current. When these gates are biased by a current of 10 to 20 mA, for example, these gates become optically transparent with perhaps some gain depending upon the level of the bias current. They are highly optically lossy at a zero bias current. One of these optical amplifiers on one side of the waver 10 is biased so that it is optically transmissive. The other optical amplifiers on the same side are unbiased. On the other side of the frequency routing device 12, one of the optical amplifiers is biased above a lasing threshold. The remaining amplifiers are unbiased to absorb any light reaching them. Application of bias current to the optical amplifiers in this manner determines a transparent route between the mirrors for lasing action. Along this route, stationary waves can be sustained for frequencies within a passband associated with this route. Frequencies outside this passband are suppressed by the lossy unbiased optical amplifiers. Lasing occurs at the Fabry-Perot mode whose frequency is nearest the passband maximum. Adjacent Fabry-Perot modes are suppressed by passband selectivity which can be adjustedby appropriate circuit design.

Figure 2:
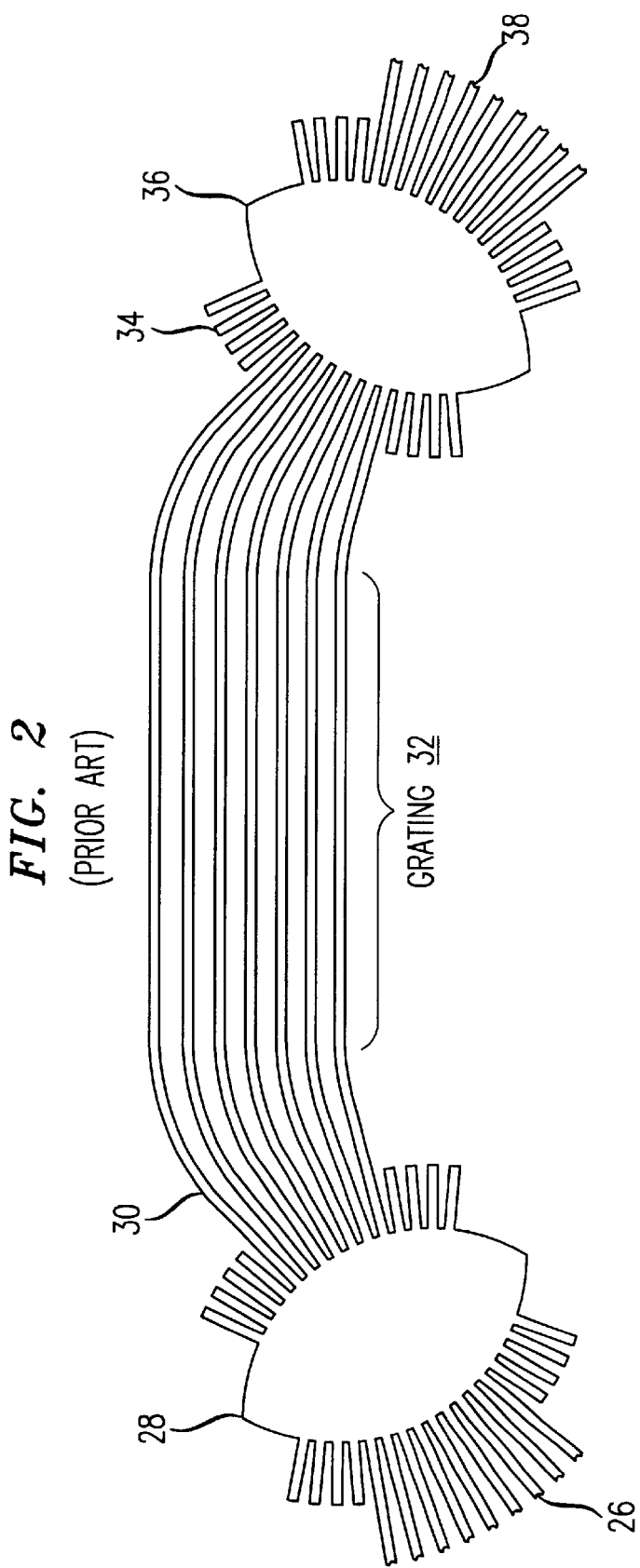
FIG. 2 is a diagram illustrating the details of a frequency routing device as used in the tunable laser of FIG. 1.

FIG. 2 shows the pertinent details of an example of a routing device 12 shown in FIG. 1. The frequency routing device contains a plurality of input waveguides 26 connected to a free space region 28. A plurality of output waveguides 30 extends from the free space region 28 and is connected to an optical grating 32. The optical grating 32 comprises a plurality of unequal length waveguides which provides a predetermined amount of path length difference between the output waveguides 30 and an corresponding plurality of input waveguides 34 connected to another free space region 36. The free space region 36 is connected to a plurality of output waveguides 38. These frequency routing devices operate as multiplexers and demultiplexers of optical frequencies. The details of their construction are more fully described elsewhere. In the case of frequency routing device 12 in FIG. 1, the input waveguides 26 may be connected to the waveguides $14_1, 14_2, \ldots, 14_N$, respectively. The plurality of output waveguides 38 are connected to waveguides $16_1, 16_2, \ldots, 16_N$, in the device of FIG. 1.

There are countless ways one can choose the arrangement of the ports on both sides of the router to make an $N_{1 \times N2}$ laser. The criteria set for the laser demonstrated here is to have 40 evenly spaced channels (with no gaps), minimize the router physical size, and have a reasonable method for coupling all the channels into a single output waveguide. A necessary condition to prevent gaps is that at least two ports on one side must be separated by only one channel spacing, and we can improve the efficiency of the output coupling scheme by having all the ports on one side be separated by only one channel spacing; and we limit the discussion in this article to such designs. Thus the geometry is $N_2$ ports spaced by one channel spacing on one side of the router, and $N_1$ ports spaced by $N_2$ channels on the other. The total number of channels is $N_1N_2$, and the simplest design would be to make the router free-spectral range, N (in terms of number of channels) be $\geq N_1N_2$. However, if we wish to maintain a narrow router passband width, the number of grating arms must remain in proportion to the free-spectral range, and thus the router will be very large physically with this simple approach.

C. R. Doerr and C. H. Joyner in an article entitled "Double-Chirping of the Waveguide Grating Router" that appeared in *IEEE Photon. Technol. Lett.*, vol. 9, pp. 776–778, 1997; and C. R. Doerr, M. Shirasaki, and C. H. Joyner in an article entitled "Chromatic Focal Plane Displacement in the Parabolic Chirped Waveguide Grating Router", that appeared in *IEEE Photon. Technol. Lett.*, vol. 9, pp. 625–627, 1997, the router may be linearly (previously called parabolic) chirp the router, causing each order of the grating to have its own focal line. Different ports may use different grating orders by placing their inlets on different focal lines, allowing for a channel span larger than the router free-spectral range. One must be careful however, that a port on a focal line closer to the router does not block the radiated mode from a port on a more distant focal line.

Figure 3:
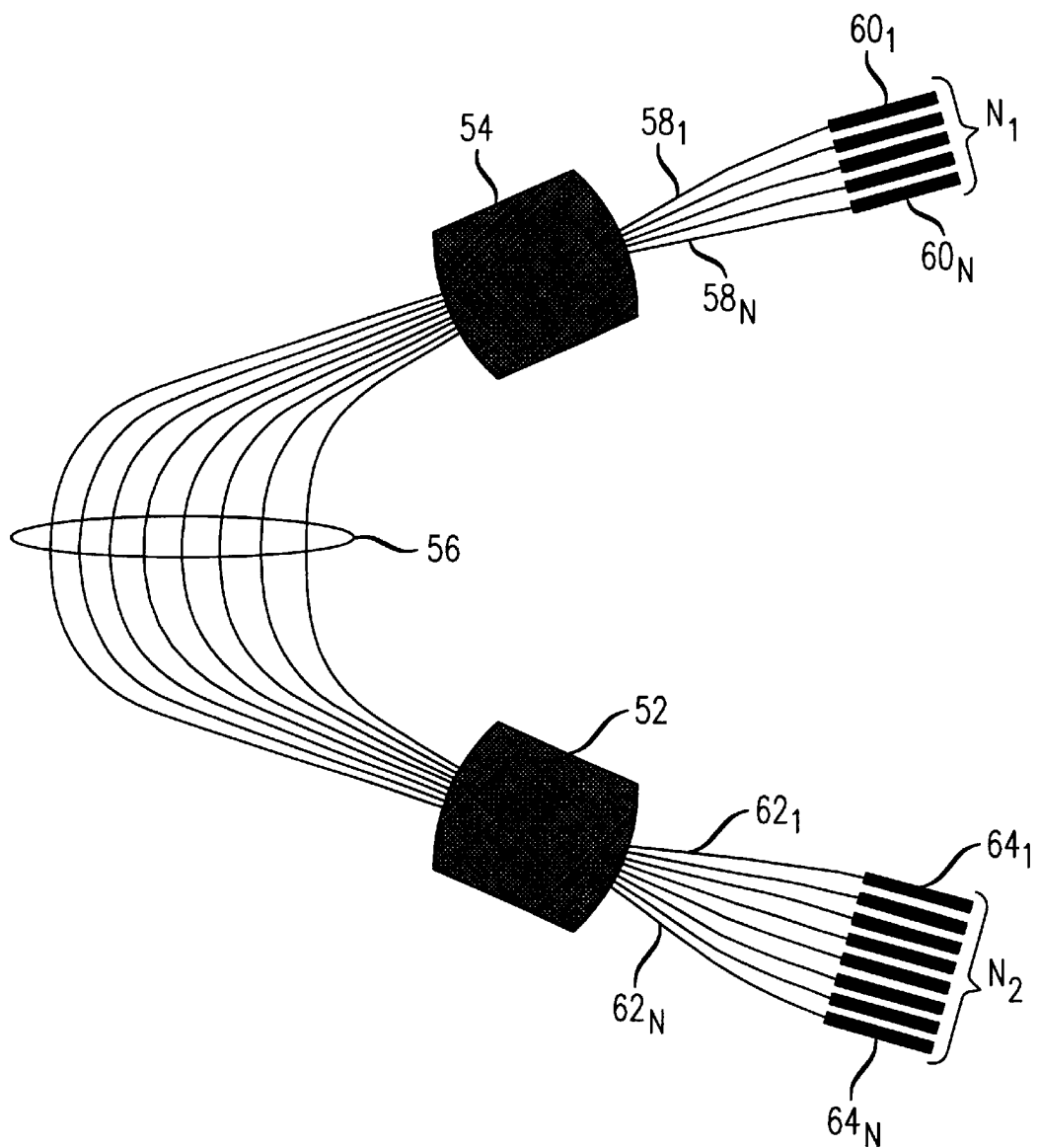
FIG. 3 is a diagram illustrating a basic $N_1 \times N_2$ multifrequency laser according to the present invention.

With this background information in place and with reference now to FIG. 3, there is shown an illustration of a basic $N_1 \times N_2$ multifrequency laser that is the subject of the present invention. Specifically, a pair of star couplers 52 and 54 are interconnected by a plurality of unequal length, parabolic chirped waveguide grating arms 56. Both of the star couplers 52, 54 include a respective set of waveguides $58_1, \ldots 58_N$, and $62_1, \ldots 62_N$, each waveguide in the set having an amplifier $60_1, \ldots 60_N$, and $64_1, 64_N$, that may be individually activated. As depicted in FIG. 3, these waveguide sets are collectevely referred to as $N_1$ and $N_2$, respectively.

Two solutions for the router free-spectral range that maximize the distances between the port inlets, minimizing the blocking, are:

$$N = \frac{N_1 N_2}{P}; \frac{N_1}{P} \neq [\text{integer} < N_1] \text{ or} \quad (1)$$

$$N = \frac{(N_1 - 1)N_2}{P}; \frac{(N_1 - 1)}{P} \neq [\text{integer} < N_1 - 1]$$

If one is willing to have a channel on the very edge of a star coupler Brillouin zone, then one can use left-hand side of Eq. (1), otherwise one should use the right-hand side. Note that P is a user-chosen integer $\leq N_1$, $N_2$ and is the number of focal lines used by the $N_1$ ports.

Figure 4:
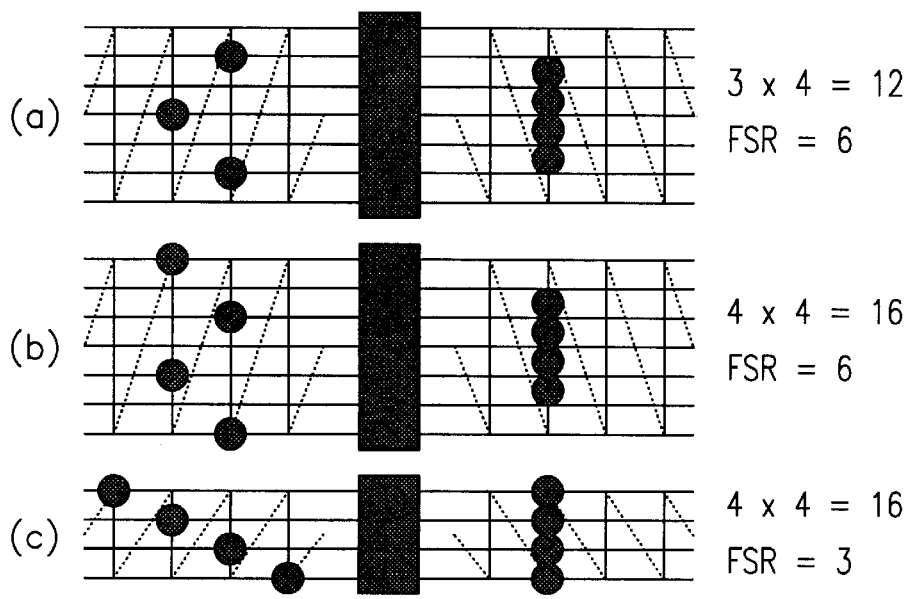
FIG. 4 is a diagram illustrating the arrangement of port inlets in a chirped waveguide grating router to achieve a tunable laser having no gaps or redundant channels.

FIG. 4 shows various examples of port inlet placement for different sets of $N_1$, $N_2$, and P, with (a) employing the left-hand side of Eq. (1) and (b) and (c) employing the right-hand side. The center rectangle in the FIG represents the linearly chirped grating, the horizontal and vertical lines represent angular and radial displacement in units of channel spacing and grating order respectively, in the star couplers. The circles represent port inlet placements and the dashed diagonal lines represent the direction of jump as a wavelength proceeds from one grating order to the next. Note how each port inlet has unimpeded access to the waveguide grating.

To make the actual router, one may employ the following relationships:

$$L(m) = \text{round}\left\{\left[m + \gamma \left(\frac{m - \frac{M+1}{2}}{1 - \frac{M+1}{2}}\right)^2\right] \frac{\Delta L \beta_c}{2\pi}\right\} \frac{2\pi}{\beta_c} + \text{constant} \quad (2)$$

$$\alpha_i(m) = \left\{m - \frac{M+1}{2} + \gamma_i^A \left[\left(\frac{m - \frac{M+1}{2}}{1 - \frac{M+1}{2}}\right)^2 - \frac{1}{3}\right]\right\} \Delta \alpha_i \quad (3)$$

$$\theta_i = q_i \frac{2\pi}{k_i R_i \Delta \alpha_i N}, \; d_i = R_i \frac{1}{\frac{k_i R_i (\Delta \alpha_i)^2 N}{4\pi(\gamma_i^F q_i + \gamma p_i N)}\left(1 - \frac{M+1}{2}\right)^2 - 1} \quad (4)$$

In which i can be either 1 or 2, representing the two star couplers. M is the total number of grating arms, L(m) is the length of grating arm m, and the $\alpha_i(m)$ are the angular positions of its two inlets. $\Delta L$ and $\Delta \alpha$ are the nominal length and inlet angular position changes, respectively, between successive grating arms, $\beta_c$ is the design center propagation constant, and round is a function that rounds to the nearest integer. $\theta_i$ and $d_i$ are the angular position and displacement from the focal line at radius $R_i$, respectively, of the ports in star coupler i with propagation constant $k_i$. $\gamma$ is the amount of linear chirp in the grating arm lengths, and $\gamma_i^A$ and $\gamma_i^F$ are the amounts of angular chirping and focal length adjustment in star coupler i. $\gamma = \gamma_1^A + \gamma_1^F = \gamma_2^A + \gamma_2^F$. Good choices for q and p, the angular position of the port inlets, normalized to the channel spacing, and the focal line number, respectively, are given by $$q_1 = \text{mod}\left[(h_1 - 1)N_2 + \frac{N}{2} - \frac{(N_1 - 1)N_2}{2P}, N\right] - \frac{N}{2}, \; q_2 = h_2 - \frac{N_2 + 1}{2} \quad (5)$$

$$p_1 = \text{floor}\left[\frac{(h_1 - 1)N_2 + \frac{N}{2} - \frac{(N_1 - 1)N_2}{2P}}{N}\right], \; p_2 = 0 \quad (6)$$

where $h_i$ is an integer between 1 and $N_i$. Floor is a function that rounds to the nearest integer toward minus infinity.

For devices with a large channel wavelength span, k can vary significantly. If one desires channels that are approximately equally spaced in frequency by $\Delta f$, we can choose $k_1 = k_c + (q+pN)2\pi n \Delta f / c$ and $k_2 = k_c$, in which $k_c$ is the propagation constant in the middle of the wavelength span, n is the refractive index and c is the speed of light.

For the exemplary device which is the subject of the present invention, I chose $N_1 = 5$, $N_2 = 8$, and $P = 2$. I opted not to have channels on the edge of Brillouin zones, so I used the left-hand side of Eq. (1). The channel spacing is 100 GHz, M=100, $\gamma_1^A = 3.2$, $\gamma_1^F = 0.8$, $\gamma_2^A = 2.0$, and $\gamma_2^F = 2.0$. The layout is shown schematically in FIG. 5.

With reference now to FIG. 5, the layout is similar to that shown in FIG. 3, with the addition of waveguide 66 coupled to star coupler 52 with the waveguide including an additional amplifier 68. Such an arrangement advantageously permits all of the channels to appear on the same output waveguide.

Figure 6:
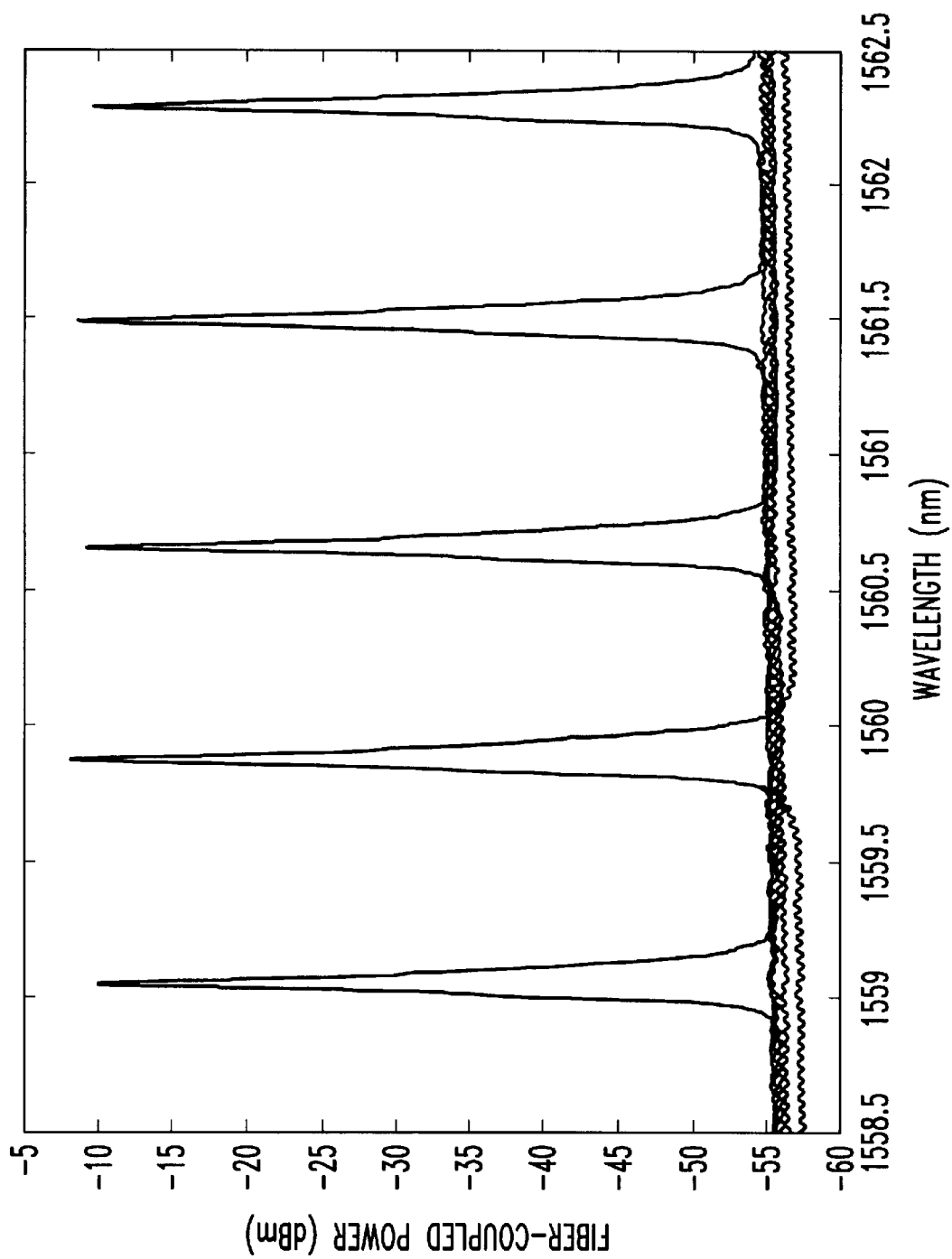
FIG. 6 is a plot showing calculated transmissivity spectra through the waveguide grating router for all port combinations, using Fourier optics.

The amount of chirp is limited by port inlet blocking in star coupler 54, and I had to use mostly angle-chirp rather than focal line adjustment in that star coupler to minimize the blocking. FIG. 6 shows the calculated transmissivities through the WGR for all 40 port combinations.

For the output, I used a waveguide 66 that is next to the grating arm inlets in star coupler 52 (FIG. 5). It is tapered to a wide width at the star coupler so that its radiation pattern is centered on the 8 port inlets of star coupler 52, maximizing the output coupling efficiency. The coupling from any of the 8 port inlets to the output is calculated to be ~−20 dB. The output has an SOA 68 to boost the power.

Figure 7:
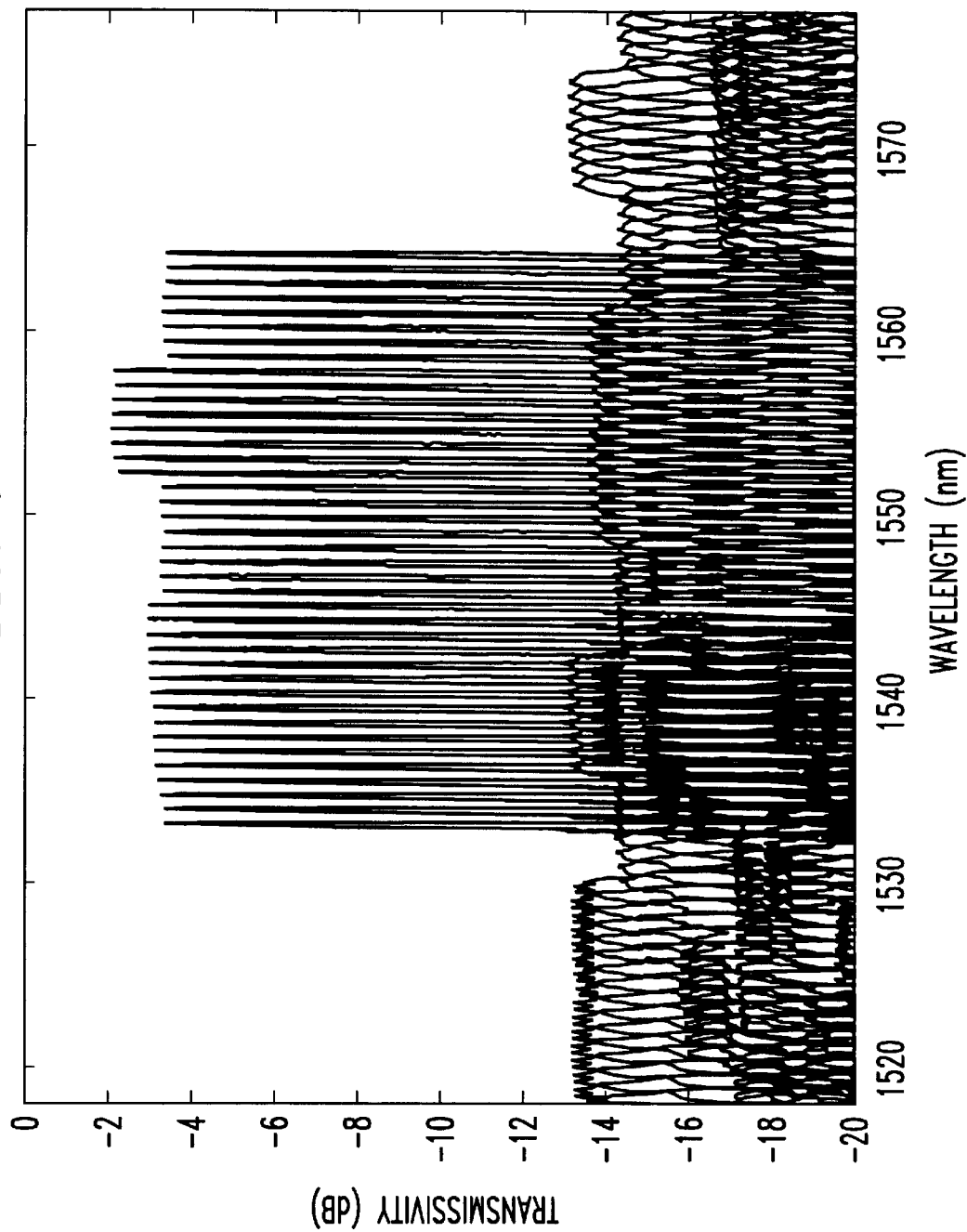
FIG. 7 is a plot showing measured spectra for all 40 channels measured one at a time having upper, lower and output amplifier currents of 100, 100, and 75 mA respectively for all cases and a resolution bandwidth of 0.1 nm.

FIG. 7 shows the oscillation spectra of each of the 40 upper-lower SOA combinations, taken one at a time, as measured from the output of an unpackaged chip using a lensed fiber. Note that in this initial device, the gain peak of the SOAs is at too high of a wavelength, ~1590 nm, and so the higher wavelength channels have significantly more power.

The exemplary device was then fully packaged device in a "butterfly" package, coating the left and right-hand facets with high-reflection (HR) and anti-reflection (AR) coatings, respectively, and affixing a lensed fiber to the right-hand facet. Unfortunately, the HR coating decreased the cavity loss so much that the lack of bandfilling in the SOAs pushed the gain peak to even longer wavelengths, and the shortest-wavelength 16 channels no longer oscillate in their desired passbands at reasonable injection currents. Nevertheless we studied the single-mode stability of the remaining 24 channels. I found that the small residual reflection from the output facet can either enhance or destroy single-mode operation, depending on the phase of the returning extra-cavity reflection, adjustable via the output SOA current, as analyzed in a hybrid integration study. To guarantee single-mode oscillation, one could either try to eliminate the reflection, or, since this laser is best suited for operation of only one channel at a time (we tried turning on many channels at once, but it led to uncontrollable behavior), one could have a look-up table for the output SOA current that depended on the activated channel.

Figure 8:
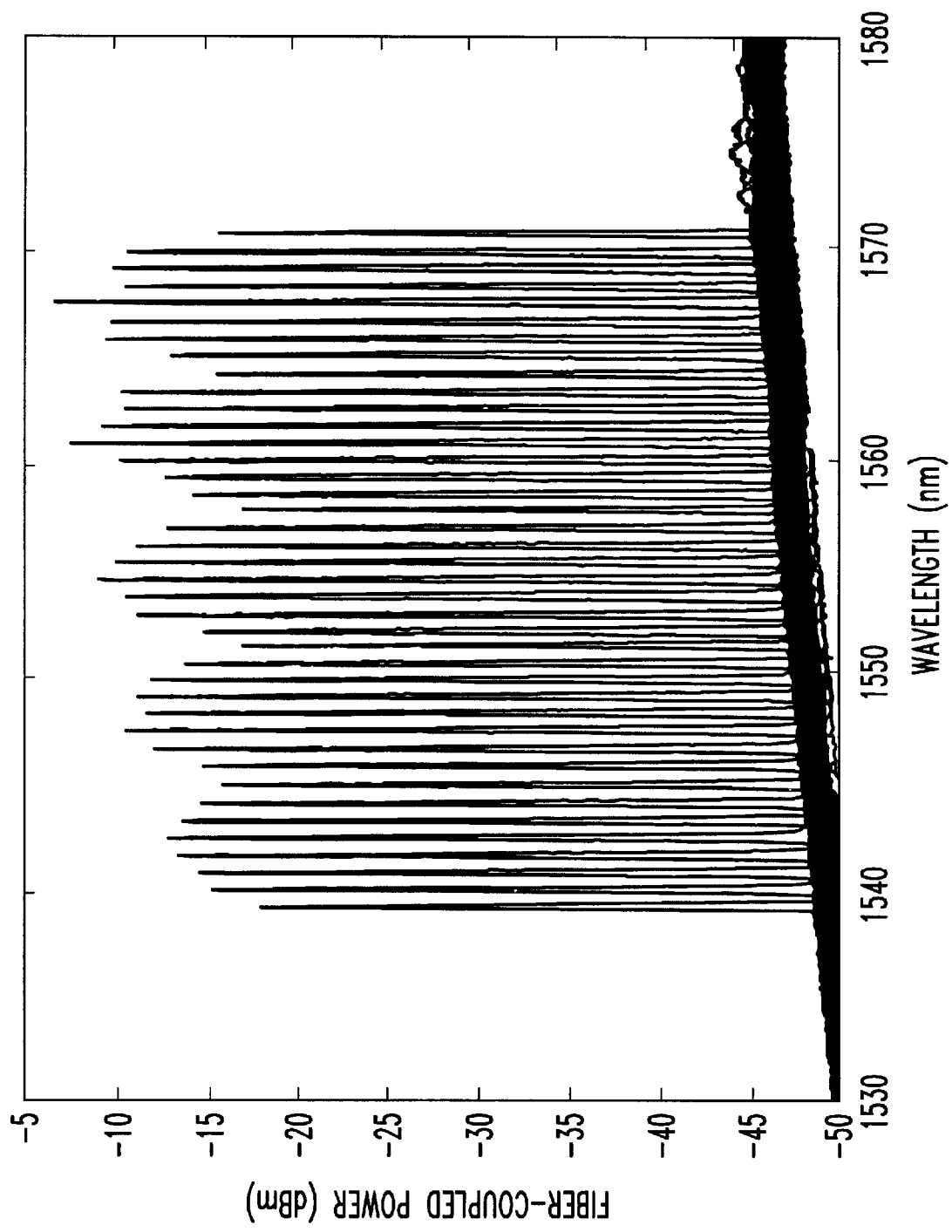
FIG. 8 is a plot showing measured spectra of 5 of the channels with upper and lower amplifier currents of 70 mA each with an output amplifier current chosen to achieve single-mode oscillation and roughly even power levels.

FIG. 8 shows oscillation spectra of five channels from the packaged device for which the output SOA current was chosen to achieve single-mode operation (100, 60, 80, 140, and 130 mA, going from left-to-right). The single-mode current range was large enough (~±20 mA) that we could still reasonably match the output power levels.

Various additional modifications of this invention will occur to those skilled in the art. Nevertheless, all deviations from the specific teachings of this specification that basically rely upon the principles and their equivalents through which the art has been advanced are properly considered within the scope of the invention as described and claimed.

The invention claimed is:

1. A tunable laser comprising:

a laser cavity defined by reflective elements in an actively doped semiconductor wafer; and a chirped, waveguide grating router formed in the cavity comprising a plurality of controllable frequency selective pathways optically connecting the reflective elements such that selective gating of one or more of the frequency selective pathways causes selected one or more lasing frequencies to be supported in the laser cavity thereby providing tunability of the laser

CHARACTERIZED IN THAT said chirped waveguide grating router is optically connected to a first set of optical amplifiers and a second set of optical amplifiers and has a nonlinear path length distribution such that a path between a selected one of the first set of amplifiers and a selected one of the second set of amplifiers will undergo laser oscillation.

2. The tunable laser of claim 1 wherein a waveguide grating arm serves as a laser output coupler.

3. The tunable laser of claim 1 wherein a free spectral range of the waveguide grating router is less than a span of possible laser oscillation wavelengths.

4. The tunable laser of claim 3 wherein a first set of $N_1$ amplifiers are connected to the waveguide grating router such that they are spaced by one channel, and the second set of amplifiers are connected to the waveguide grating router such that they are speced by $N_1$ channels.

5. The tunable laser of claim 3 wheriein a waveguide grating arm serves as a laser output coupler.

* * * * *